United States Patent [19]

Mammato et al.

[11] Patent Number: 5,019,488
[45] Date of Patent: May 28, 1991

[54] METHOD OF PRODUCING AN IMAGE REVERSAL NEGATIVE PHOTORESIST HAVING A PHOTO-LABILE BLOCKED IMIDE

[75] Inventors: Donald C. Mammato, Lebanon; Sangya Jain, Bridgewater, both of N.J.; Dana Durham, East Greenwich, R.I.; Mark A. Spak, Edison, N.J.; Douglas A. Usifer, Belle Mead, N.J.; Michael McFarland, Washington, N.J.

[73] Assignee: Hoechst Celanese Corporation, Somerville, N.J.

[21] Appl. No.: 517,530

[22] Filed: Apr. 24, 1990

Related U.S. Application Data

[63] Continuation of Ser. No. 250,866, Sep. 29, 1988, abandoned.

[51] Int. Cl.$^5$ ............... G03C 5/16; G03F 7/40; G03F 7/022; G03F 7/039
[52] U.S. Cl. ................... 430/325; 430/328; 430/330
[58] Field of Search ............. 430/325, 330, 326

[56] References Cited

U.S. PATENT DOCUMENTS

| | | | |
|---|---|---|---|
| 4,496,647 | 1/1985 | Kawabe et al. | 430/303 |
| 4,546,066 | 10/1985 | Fields et al. | 430/325 |
| 4,576,901 | 3/1986 | Stahlhofen et al. | 430/325 |
| 4,581,321 | 4/1986 | Stahlhofen | 430/325 |
| 4,663,268 | 5/1987 | Turner et al. | 430/325 |
| 4,696,891 | 9/1987 | Guzzi | 430/325 |
| 4,736,055 | 4/1988 | Dietliker et al. | 560/13 |
| 4,775,609 | 10/1988 | McFarland | 430/325 |
| 4,810,613 | 3/1989 | Osuch et al. | 430/326 |

*Primary Examiner*—Charles L. Bowers, Jr.
*Assistant Examiner*—Mark R. Buscher
*Attorney, Agent, or Firm*—Richard S. Roberts

[57] ABSTRACT

A method for producing a negative image by coating a substrate with a photosensitive layer containing a blocked hydrophobic polymer capable of deblocking in the presence of an acid, and an oxime sulfonate ester or o-quinone-4-sulfonyl-containing diazide, then imagewise exposing, treating with a gaseous base, removing excess base, overall flood exposing, baking and developing with an aqueous alkaline solution.

35 Claims, No Drawings

METHOD OF PRODUCING AN IMAGE REVERSAL NEGATIVE PHOTORESIST HAVING A PHOTO-LABILE BLOCKED IMIDE

This is a continuation of co-pending application Ser. No. 250,866, filed on Sept. 29, 1988, now abandoned.

BACKGROUND OF THE INVENTION

This invention relates to a method for producing a negative image employing compositions containing a resin which is a photolabile, blocked imide polymer together with a sensitizing agent which is a photoacid generator capable of de-blocking the imide upon exposure to actinic radiation.

It is well known in the art to produce positive photoresist formulations such as those described in U.S. Pat. Nos. 3,666,473; 4,115,128 and 4,173,470. These include alkali-soluble phenol-formaldehyde novolak resins together with light-sensitive materials, usually a substituted naphthoquinone diazide compound. The resins and sensitizers are dissolved in an organic solvent or mixture of solvents and are applied as a thin film or coating to a substrate suitable for the particular application desired. The resin component of these photoresist formulations is soluble in aqueous alkaline solutions, but the sensitizer is not. Upon imagewise exposure of the coated substrate to actinic radiation, the exposed areas of the coating are rendered more soluble than the unexposed areas. This difference in solubility rates causes the exposed areas of the photoresist coating to be dissolved when the substrate is immersed in an alkaline developing solution while the unexposed areas are largely unaffected, thus producing a positive relief pattern on the substrate.

Photoresists are generally categorized as being either positive working or negative working. In a negative working resist composition, the imagewise light struck areas harden and form the image areas of the resist after removal of the unexposed areas with a developer. In a positive working resist the exposed areas are the non-image areas. The light struck parts are rendered soluble in aqueous alkali developers.

It has been observed that existing negative acting photoresist films have a tendency to swell during the development because organic solvents are employed as developers. Consequently, it is difficult to form patterns having a narrow open gap between two pads of resist because the resist remaining behind swells such that the narrow gap is bridged over, and the pads will touch each other during development. Even though the resist film will shrink after being removed from the developer, in the locations where swollen resist contacted another part of the pattern a stringy or filmy bridge will be created between the two parts of the pattern.

Due to these swelling problems and because positive acting resists are known not to swell upon development, it has become accepted practice to utilize positive acting resists for high resolution microphoto-lithography.

While negative resists are the most widely used for industrial production of printed circuit boards, positive resists are capable of much finer resolution and smaller imaging geometries. Hence positive resists are the choice for the manufacture of densely packed integrated circuits. In many commercial applications, it is desirable to convert a high resolution quinone diazide type positive resist for a negative working application because for some patterns it would be more convenient to be able to use a negative resist. For example, a mask of a certain pattern may be more easily prepared, or might be more reliable to use if it were mostly dark with a few clear areas rather than if it were the opposite tone, namely, mostly clear with a few dark areas. That this might be the case can readily be imagined by considering the effect of dust particles on a mostly clear mask as opposed to a mostly dark mask. Any dust particle in the mask's clear area will be reproduced in the resist as a defect regardless of the tone of the resist. Therefore, the mostly clear mask has, proportionately, a greater area susceptible to particle contamination than does the mostly dark mask.

As a result, there is interest in the field of image reversal because of the utility of this process in practical device manufacturing. Among the practical aspects of image reversal are the elimination of the need for a dual set of complementary masks to do both positive and negative imaging, greater resolution and process latitude than with positive imaging alone, reduction in standing wave effects, and higher thermal stability. In this regard, several methods are known in the art for such image reversal. For example, it is known that conventional positive acting photoresists comprised of novolac binder resin and diazoketone or diazoquinone photosensitizer can be caused to yield negative images as disclosed in U.S. Pat. No. 4,104,070.

Conventional image reversal novolak photoresists are limited in that they cannot be exposed at short ultraviolet wavelengths, i.e. less than about 300 nm, to give high resolution images because of the intense absorbency of novolak resin in this region. This invention circumvents this problem by using different binder resins. The sensitizers are compounds which produce a strong acid upon photolysis, while the resins are polymers selected for their UV-transparency and other physical properties. The resins have as an integral part an acid labile group, the removal of which is capable of transforming the polymer from insoluble in aqueous developer to soluble in aqueous developer.

SUMMARY OF THE INVENTION

The invention provides a method of producing a negative image which comprises
  a. providing a layer of a substantially dry photosensitive composition on a substrate said composition comprising
    i. a photosensitive compound capable of generating a sufficient amount of a strong acid upon exposure to radiant energy, such that said acid, upon subsequent heating to a sufficient temperature is capable of deblocking a blocked hydrophobic polymer, to render the polymer soluble in an aqueous alkaline solution, said photosensitive compound being selected from the group consisting of
      1. an oxime sulfonate ester; and
      2. a compound having the formula

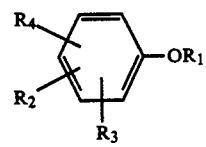

-continued wherein R₁ = 1,2 benzoquinone-2-diazide-4-sulfonyl;
1,2 naphthoquinone-2-diazide-4-sulfonyl;
or
1,2 anthroquinone-2-diazide-4-sulfonyl

$R_2 = H, R_7, OR_6$ or $\overset{O}{\underset{\|}{C}}-R_7$

$R_3 = H, R_7, OR_6$ or $\overset{O}{\underset{\|}{C}}-R_7$

$R_4 = H, R_7, OR_6$ or $\overset{O}{\underset{\|}{C}}-R_7$ $R_6$ = H, alkyl, aryl, aralkyl or $R_1$
$R_7$ = alkyl, aryl or aralkyl; and ii. a blocked hydrophobic polymer in sufficient amount to form a uniform layer of said composition on the substrate; and b. imagewise exposing said layer to sufficient radiant energy to generate an acid without de-blocking said polymer; and c. in the absence of a post-exposure baking step, treating the exposed layer with a gaseous base to neutralize the acid generated in step (b) to a salt via an acid-base reaction; and d. removing excess base; and e. overall flood exposing the layer to generate an acid in areas not exposed in step (b); and f. baking the exposed layer of step (e) at a sufficient temperature and for a sufficient time to deblock said polymer in the areas not exposed in step (b); and g. developing the layer with an aqueous alkaline developer to remove the layer except for the portion exposed in step (b).

DETAILED DESCRIPTION OF THE PREFERRED EMBODIMENT

As a first step in the production of the photographic element of the present invention, one coats and dries the foregoing photosensitive composition on a suitable substrate. The applied composition contains a solvent, polymer and photosensitizer. The polymer is a hydrophobic blocked polymer.

The method is practiced by performing the following steps:

1 Coating the substrate with a photosensitive layer comprising a hydrophobic blocked polymer, latent photoacid and solvent and drying the solvent until the layer is substantially non-tacky.

2. Exposing the layer through a mask to generate a photoacid in the exposed area but without deblocking the polymer.

3. Without carrying out a baking step to deblock the polymer, treating the resist film by contacting it with the gaseous base, such as ammonia or triethylamine to neutralize the acid generated in step 2 to a salt via an acid-base reaction.

4. Removing excess base, e.g., by evacuation or placing the substrate in a stream of inert gas.

5. Flood exposing the entire layer to photogenerate acid in area not exposed in step 2.

6. Baking the substrate and resist film to deblock the polymer in the region not exposed in step 2.

7. Development of the film in aqueous alkali solution to give the negative image of the mask by removing the layer except for the portion exposed in step 2.

It has been discovered that the following chemical steps are important in this invention. In step 2. of the above sequence of steps, sensitizer is converted to strong acid in those areas which receive exposure through open areas of the mask. The acid should not deblock the hydrophobic polymer at normal temperatures, otherwise it will become soluble in aqueous developer and the neutralization step 3. will not be effective. In step 3., the gaseous base enters the film and undergoes an acid/base reaction with the photogenerated acid. In this manner, the acid becomes a salt. This salt will no longer have the ability to catalyze the crucial removal of the acid labile group of the polymer, i.e., deblock it.

The present photoresists require that a hydrophobic species be formed to prevent the resin from dissolving. Conversely, the preferred photoacids for the present invention produce strong acids such as $CF_3SO_3H$, p-toluene sulfonic acid and $H_2SO_4$ which can react with amines to give salts, but do not form any insoluble species.

The important characteristics of the base are a reasonably high vapor pressure at room temperature and the ability to penetrate the film and react with the photoacid. This dictates that the base be a small molecule such as ammonia or an organic amine with less than 12 carbon atoms. In step 4., the wafer is placed in a vacuum or a steam of inert gas for a short time to remove any excess gaseous base. The ease of removal dictates which of the amines of step 3. is preferred. In step 5., the entire wafer is flood exposed, which transforms the remaining sensitizer to photoacid. This sensitizer is that which was not exposed (under the dark areas of the mask) in the original imagewise exposure. Thus, the concentration of acid in the film is reversed from that obtained with the mask pattern in a normal one-step exposure. In the baking step 6., the acid catalyzes the removal of the acid labile groups from the polymer as described in U.S. Pat. No. 4,491,628. This removal renders the polymer soluble in aqueous developer in those areas. In the areas which were irradiated by the imagewise exposure, the photoacid has been rendered ineffective by the neutralization step 3., so the removal of the acid labile groups does not proceed and the polymer remains insoluble. In step 7., the wafer is placed in aqueous alkali solution which washes away the areas of the film that have undergone the acid catalyzed removal of the labile groups. The end result is a relief pattern of resist film on the substrate which duplicates the mask, but in reverse. That is, the areas that remain and the areas that are washed away are opposite from that which would be obtained if steps 3., 4., and 5 were omitted.

Any of a variety of suitable gaseous bases in addition to ammonia and triethylamine may be employed in practicing the method of the invention. Preferred compounds include, for example, any of various primary, secondary or tertiary amines, more particularly those having 1 to 12 carbon atoms and which generate vapor capable of penetrating the photoresist film.

Any of various known resins which depend on a photoacid to chemically convert them to a soluble species from an insoluble species may be used as the polymeric constituent of the photoresist. Preferred are the polymers disclosed in co-pending application U.S. Ser.

No. 832,116 which is incorporated herein by reference. Examples of such polymers are N-tert-butyloxycarbonyl maleimide/styrene copolymer, N-tert-butyloxycarbonyl maleimide homopolymer, N-tert-butyloxycarbonyl maleimide/vinyl ether copolymers where the vinyl ether is aliphatic from 3 (methyl vinyl ether) to 20 (octadecylvinyl ether) carbon atoms, N-tert-butyloxycarbonyl maleimide/2,4-disubstituted styrene copolymers where the styrene is substituted at the 2 and 4 positions with, independently, $C_1$ to $C_5$ alkyl groups or H. Other polymers which may be used include those in which a phenol containing polymer has the hydroxyl functionalities blocked with an acid-labile group such as poly(tert-butyloxycarbonyloxy-alpha-alkyl styrene) or a copolymer thereof, poly(tert-butyloxycarbonyloxy styrene) or a copolymer thereof, or polymers containing other acidic imide functionalities (—CO—NH—CO—) blocked by an acid labile group such as poly(dimethyl-N-tert-butyloxycarbonyl glutarimide), or polymers containing carboxylic acid functionalities blocked by an acid labile group such as poly(dimethyl-N-tert-butyloxycarbonyl glutarimide), or polymers containing carboxylic acid functionalities blocked by an acid labile group such as poly(tert-butyl p-vinylbenzoate) or a copolymer thereof, poly(tert-butyl methacrylate) or a copolymer thereof, and the like. Other blocking groups may be present on the polymers to yield materials useful for the method of the invention. Examples of such groups may be found in U.S. patent application Ser. No. 832,116 filed Feb. 24, 1986 and U.S. Pat. No. 4,491,628, e.g., benzyloxycarbonyl. Still other preferred acid labile polymers are those of co-pending U.S. patent application Ser. No. 052,950 filed May 27, 1987. All of the foregoing patents and applications are incorporated herein by reference. Such polymers contain imide groups blocked by a methyol or substituted methylol group and further blocked to form an acetal or ketal.

The polymer resins suitable for use consist of copolymers, or homopolymers, of the monomers which have the structure

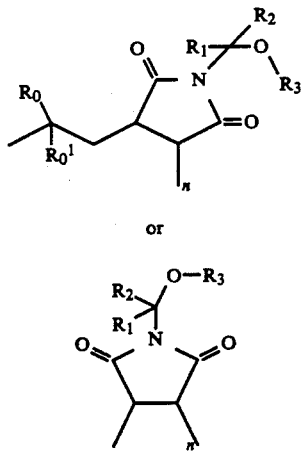

where:
$R_0$ is H or methyl
$R_0^1$ is aryl, O-alkyl, or O-aryl
$R_1$, $R_2$, and $R_3$ are as defined above with respect to the monomer.

When $R_3$ is removed by the action of the photoacid, the methylol group (where $R_1$ and $R_2$ are H), or a substituted equivalent, remains attached to the nitrogen. These groups are removed by action of the alkaline developing solution to leave the polymer having the basic succinimide structure

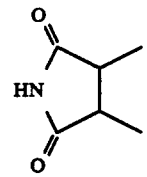

which is soluble in the alkaline solution, permitting complete removal of the exposed photoresist composition.

In general, these polymers can be prepared by standard free radical polymerization techniques from the monomers of the invention, either alone if homopolymer is desired, or by copolymerization with co-monomers which provide the $R_0$ and $R_0^1$ groups defined above.

The polymers of the present invention must contain a proportion of acid degradable groups large enough to create a significant solubility difference between irradiated and unirradiated areas. Typically, the mol ratio of comonomer to substituted methylol maleimide will be between 0 (no comonomer) and 1. If the amount of comonomer is greater, an adverse effect on solubility has been found and the mol ratio should not exceed about 5/1.

The comonomer may be chosen from a wide group of vinyl compounds, but most useful are electron-rich vinyl compounds such as styrenes or vinyl ethers. Electron-rich comonomers tend to give an alternating structure upon polymerization with the double blocked methylol maleimide monomer. This has the advantage of creating a uniform polymer for which each molecular chain has approximately the same ratio of monomers without the use of special polymerization techniques such as polymerization to low percent conversion, feeding in one monomer during reaction, or using flow reactors. Preferred comonomers are styrene, alphamethylstyrene, butyl vinyl ether, and butyl alphamethylvinyl ether.

In addition to the polymers discussed above, the photosensitive composition will include a latent photoacid and a solvent and may optionally include stabilizers or other additives.

The latent photoacid of the present invention will be chosen from neutral substances capable of producing an acid after reaction with actinic radiation. The choice is determined by several factors, including the type of radiation to which sensitivity is desired. Clearly, the photoacid must absorb radiation at the frequency to be used, but it also must convert the radiation efficiently into the acid needed to deblock the polymers. In addition to being non-acidic, the unexposed, latent photoacid must not react with the polymer before exposure by actinic radiation and must be compatible with it. For example, the latent photoacid must not separate as a distinct macroscopic phase during preparation of the resist film. Also, the latent photoacid must not be so volatile that it tends to evaporate from the deposited film. Generally, the latent photoacids will have a boiling point of 150°–200° C. or higher. It is desirable that the latent photoacid not be unstable at temperatures below about 90° C., to allow for the possibility of a baking step, the purpose of which is to remove the resist solvent. Suitable compounds include the foregoing o-quinone-4-sulfonyl-diazides set forth above.

It has been found that 4-sulfonyl isomer diazides generate more acid than other known isomers, which renders this diazide class useful for this invention. Such sensitizing compounds are also disclosed, in U.S. Pat. Nos. 2,797,213; 3,106,465; 3,148,983; 3,130,047; 3,201,329; 3,785,825; and 3,802,885, which are incorporated herein by reference.

The o-quinone diazides are well known to the skilled artisan as demonstrated by *Light Sensitive Systems*, Kosar, J.; John Wiley & Sons, New York, 1965 in Chapter 7.4 which is also incorporated herein by reference.

It presently appears that the number of fused rings is not important for this invention but the position of the sulfonyl group is important. That is, one may use benzoquinones, naphthoquinones or anthroquinones as long as the oxygen is in the 1 position, diazo is in the 2 position and the sulfonyl group is in the 4 position. Likewise the phenolic member to which it is attached does not appear to be important. For example it can be a cumylphenol derivative as taught in U.S. Pat. No. 3,640,992 or it can be a mono-, di-, or tri-hydroxyphenyl alkyl ketone or benzophenone as shown in U.S. Pat. No. 4,499,171. Both of these patents are incorporated herein by reference.

The oxime sulfonate esters which liberate a sulfonic acid on exposure to deep UV radiation are typically of the formula:

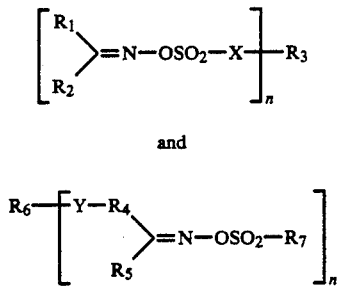

and $$\left[ R_6 \substack{Y-R_4 \\ \phantom{Y} \diagdown \\ \phantom{Y} R_5} =N-OSO_2-R_7 \right]_n \qquad \text{II}$$

where
n is 1 or 2, preferably 1,
$R_1$ is —COO alkyl or —COO aryl or preferably —CN, and
$R_2$ is alkyl or aryl, preferably phenyl unsubstituted or substituted by $C_1$-$C_6$ alkyl,—OH, —CN, $C_1$-$C_4$-alkoxy, aryloxy,
—COO aryl or —COO alkyl, or $NO_2$ or
$R_2$ and $R_1$ together with the atom to which they are bound form a $C_5$-$C_{10}$ carbocyclic or heterocyclic ring; and
X and Y are independently selected form a direct bond, or they are —$CH_2$— or $C_2$-$C_5$ alkylene unsubstituted or substituted.
$R_3$ is, when n=1, $C_1$-$C_{18}$-alkyl, most preferably methyl or phenyl which may be unsubstituted or substituted by —OH, —CN, halogen, $C_1$-$C_{12}$-alkyl, $C_1$-$C_4$-alkoxy, or $NO_2$; or it is naphthyl which is optionally substituted, or $R_3$ and $R_2$ or $R_3$ and $R_1$ together with the atoms to which they are bonded form a $C_5$-$C_{12}$ heterocyclic ring, and $R_3$ is, when n=2, a $(CH_2)_m$ group, wherein m is 2 to 8, or phenylene or naphthylene each optionally substituted.

$R_4$ represents arylene, preferably, phenylene, or it is a substituted arylene, methylene, $C_2$-$C_6$ straight, branched, or cyclic alkylene; and
$R_5$ is preferably cyano, or it represents a —COO alkyl or —COO aryl group.
$R_6$ is, when n=1, preferably a hydrogen atom, or it represents $C_1$-$C_8$ alkyl, or phenyl, phenyl substituted with —OH, —CN, $C_1$-$C_4$ alkoxy, aryloxy, —COO alkyl, —COO aryl, $NO_2$, or halogen; or $R_5$ and $R_6$ together with the atoms to which they are bound form a $C_6$-$C_{12}$ carbocyclic or heterocyclic ring.
$R_7$ is preferably phenyl unsubstituted or substituted by —OH, —CN, alkoxy, or halogen, or $C_1$-$C_5$ alkyl, preferably methyl, or it represents $C_1$-$C_{18}$ straight or branched alkyl which may be substituted or unsubstituted; or it is $C_6$-$C_{12}$ aryl, optionally substituted, or $R_7$ and $R_6$ or $R_5$ and $R_7$, together with the atoms to which they are bound, form a $C_6$-$C_{12}$ heterocyclic ring.

European Patent No. 0 139 609 B1 issued Feb. 4, 1987 describes systems of the above type employed as curing agents for lacquers.

The oxime sulfonate esters of the invention can be easily prepared in good yield by reaction of a compound bearing oxime functionality with a compound bearing sulfonyl chloride functionality in the presence of a suitable base, such as pyridine, or triethylamine, or N-methylmorpholine, in a suitable organic solvent, such as N-methylpyrrolidinone, N,N-dimethylacetamide, N,N-dimethylformamide, methylene chloride, tetrahydrofuran, propylene glycol methyl ether acetate. Additionally, the reaction is carried out in a solvent that can also act as a base, such as pyridine. The product can be precipitated from the reaction mixture by the addition of the reaction mixture to a solvent, which is being stirred, that is miscible with the reaction solvent, yet immiscible with the desired product. Such a procedure can be exemplified by the addition of an N-methylpyrrolidinone solvent reaction mixture into water that is being agitated or stirred. Alternatively, the product could be isolated by washing an organic reaction mixture with water to remove water miscible salts and then evaporating the organic solvent to dryness to recover the desired product. The oxime sulfonate esters obtained from the this procedure are usually recrystallized from a suitable solvent; however, the product obtained from the reaction mixture before recrystallization is usually sufficiently pure for use in the present invention. The starting oxime containing compound, if not available from commercial chemical suppliers, can be easily prepared by conventional synthetic procedures. Examples of these types of preparations may be found in "The Systematic Identification of Organic Compounds," John Wiley and Sons, New York, 1980, p. 181, or *Die Makromoleculare Chemie*, 1967, 108, 170, or *Organic Synthesis*, 1979, 59, 95 which are incorporated herein by reference.

The photosensitive composition is formed by blending the ingredients in a suitable solvent composition. In the preferred embodiment the resin is preferably present in the overall composition in an amount of from about 50% to about 99% based on the weight of the solid, i.e. non-solvent parts of the composition. A more preferred range of resin would be from about 80% to about 99% and most preferably from about 82% to about 85% by weight of the solid composition parts. The diazide or oxime sulfonate ester is preferably present in an amount ranging from about 1% to about 50% based on the weight of the solid, i.e., non-solvent parts of the composition. A more preferred range of the diazide or oxime sulfonate ester would be from about 1% to about 20% and more preferably from about 10% to about 18% by weight of the solid composition parts. In manufacturing the composition the resin, and diazide or oxime sulfonate ester are mixed with such solvents as the propylene glycol alkyl ether acetate, butyl acetate, xylene, ethylene glycol monoethyl ether acetate, and propylene glycol methyl ether acetate, among others.

Additives such as colorants, dyes, anti-striation agents, leveling agents, plasticizers, adhesion promoters, speed enhancers, solvents and such surfactants as non-ionic surfactants may be added to the solution of resin, sensitizer, and solvent before the solution is coated onto a substrate.

Examples of dye additives that may be used together with the photoresist compositions of the present invention include Methyl Violet 2B (C.I. No. 42535), Crystal Violet (C.I. 42555), Malachite Green (C.I. No. 42000), Victoria Blue B (C.I. No. 44045) and Neutral Red (C.I. No. 50040) at one to ten percent weight levels, based on the combined weight of the solid parts of the composition. The dye additives help provide increased resolution by inhibiting back scattering of light off the substrate.

Anti-striation agents may be used up to five percent weight level, based on the combined weight of solids.

Plasticizers which may be used include, for example, phosphoric acid tri-beta-chloroethyl)-ester; stearic acid; dicamphor; polypropylene; acetal resins; phenoxy resins; and alkyl resins at one to ten percent weight levels, based on the combined weight of solids. The plasticizer additives improve the coating properties of the material and enable the application of a film that is smooth and of uniform thickness to the substrate.

Adhesion promoters which may be used include, for example, beta(3,4-epoxy-cyclohexyl)-ethyltrimethoxysilane; p-methyl-disilanemethyl methacrylate; vinyltrichlorosilane; and gamma-amino-propyl triethoxysilane up to a 4 percent weight level, based on the combined weight of solids.

Speed enhancers that may be used include, for example, picric acid, nicotinic acid or nitrocinnamic acid at a weight level of up to 20 percent, based on the combined weight of resin and solids. These enhancers tend to increase the solubility of the photoresist coating in both the exposed and unexposed areas, and thus they are used in applications when speed of development is the overriding consideration even though some degree of contrast may be sacrificed; i.e, while the exposed areas of the photoresist coating will be dissolved more quickly by the developer, the speed enhancers will also cause a larger loss of photoresist coating from the unexposed areas.

The coating solvents may be present in the overall composition in an amount of up to 95% by weight of the solids in the composition.

Non-ionic surfactants that may be used include, for example, nonylphenoxy poly(ethyleneoxy) ethanol; octylphenoxy(ethyleneoxy) ethanol; and dinonyl phenoxy poly (ethyleneoxy) ethanol at up to 10 percent weight based on the combined weight of solids.

The prepared resist solution can be applied to a substrate by any conventional method used in the photoresist art, including dipping, spraying, whirling and spin coating. When spin coating, for example, the resist solution can be adjusted as to the percentage of solids content in order to provide coating of the desired thickness given the type of spinning equipment utilized and the amount of time allowed for the spinning process. Suitable substrates include silicon, aluminum or polymeric resins, silicon dioxide, doped silicon dioxide, silicon nitride, tantalum, copper, polysilicon, ceramics and aluminum/copper mixtures.

The photoresist coatings produced by the above described procedure are particularly suitable for application to thermally grown silicon/silicon dioxide-coated wafers such as are utilized in the production of microprocessors and other miniaturized integrated circuit components. An aluminum/aluminum oxide wafer can be used as well. The substrate may also comprise various polymeric resins especially transparent polymers such as polyesters.

After the resist composition solution is coated onto the substrate, the substrate is temperature treated at approximately 20° to 100° C. This temperature treatment is selected in order to reduce and control the concentration of residual solvents in the photoresist while not causing substantial thermal degradation of the photosensitizer. In general one desires to minimize the concentration of solvents and thus this temperature treatment is conducted until substantially all of the solvents have evaporated and a thin coating of photoresists composition, on the order of a micron in thickness, remains on the substrate. This treatment is normally conducted at temperatures in the rang of from about 20° C. to about 100° C. In a preferred embodiment the temperature is conducted at from about 50° C. to about 90° C. A more preferred range is from about 70° C. to about 90° C. This treatment is conducted until the rate of change of solvent removal becomes relatively insignificant. The temperature and time selection depends on the resist properties desired by the user as well as equipment used and commercially desired coating times. Commercially acceptable treatment times for hot plate treatment are those up to about 3 minutes, more preferably up to about 1 minute. In one example, a 30 second treatment at 90° is useful. The coating substrate can then be exposed to actinic radiation, especially ultraviolet radiation, in any desired pattern, produced by use of suitable masks, negatives, stencils, templates, etc. in a manner well known to the skilled artisan.

The development step may be conducted by immersion in a suitable developing solution. The solution is preferably agitated, for example, by nitrogen burst agitation. The substrates are allowed to remain in the developer until all, or substantially all, of the resist coating has dissolved from the exposed areas. Suitable developers include aqueous alkaline solutions such as those including sodium hydroxide, and tetramethyl ammonium hydroxide as are well known in the art.

After removal of the coated wafers from the developing solution, a optional post-development heat treatment or bake may be employed to increase the coating's adhesion and chemical resistance to etching solutions and other substances. The post-development heat treatment ca comprise the oven baking of the coating and substrate below the coating's softening point. In industrial applications, particularly in the manufacture of microcircuitry units on silicon/silicon dioxide-type substrates, the developed substrates may be treated with a buffered, hydrofluoric acid base etching solution. The resist compositions of the present invention are resistant to acid-base etching solutions and provide effective protection for the unexposed resist-coating areas of the substrate.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLE 1

The following composition is prepared.

3.0 g poly[styrene-co-(N-t-butoxycarbonyl)maleimide]
10 g propylene glycol monomethyl ether acetate
0.33 g condensation product of 2,3,4 trihydroxybenzophenone with
90/10 mixture of 1,2 naphthaquinone-2-diazide-4-sulfonyl chloride and 1,2 naphthaquinone-2-diazide 5-sulfonyl chloride.

The solution is spin coated onto a silicon wafer and baked to substantially remove the solvent. A 1 micron thick film is obtained. The resist is exposed with deep UV radiation through a mask with graduated and known optical density. After exposure the resist is held in ammonia vapor at room temperature for 10 minutes. It is placed in vacuum for 10 minutes to remove any residual ammonia in the film. A deep UV flood exposure of 200 mJ is given, followed by a post exposure bake of 125° C. for 60 sec. on a hot plate. The resist is developed in 0.075 N tetramethylammonium hydroxide. A negative image is obtained with a photospeed of 16 mJcm$^{-2}$ and a contrast of 7.

EXAMPLE 2

The following composition is prepared.

2.0 g poly[styrene-co(N-t-butoxycarbonyl)maleimide]
8.26 g propylene glycol monomethylether acetate
0.064 g o-p-toluene-sulfonyl-alpha-hydroxyiminobenzyl cyanide The process given in Example 1 is repeated with this sample. A negative image is obtained with a photospeed of 36 mJ/cm$^2$ and a contrast of 7.7.

What is claimed:

1. A method of producing a negative image which comprises
   a. providing a layer of a substantially dry photosensitive composition on a substrate said composition comprising
      i. a photosensitive compound capable of generating a sufficient amount of a strong acid upon exposure to radiant energy, such that said acid, upon subsequent heating to a sufficient temperature is capable of deblocking a blocked hydrophobic polymer, to render the polymer soluble in an aqueous alkaline solution, said photosensitive compound being selected from the group consisting of
         1. an oxime sulfonate ester; and
         2. a compound having the formula

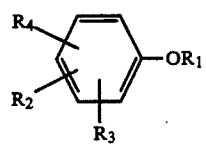

wherein $R_1$ = 1,2 benzoquinone-2-diazide-4-sulfonyl;
1,2 naphthoquinone-2-diazide-4-sulfonyl;
or
1,2 anthroquinone-2-diazide-4-sulfonyl

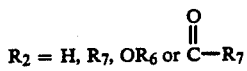

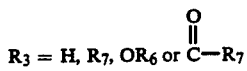

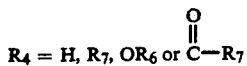

$R_6$ = H, alkyl, aryl, aralkyl or $R_1$
$R_7$ = alkyl, aryl or aralkyl; and ii. a blocked hydrophobic polymer in sufficient amount to form a uniform layer of said composition on the substrate; and
   b. imagewise exposing said layer to sufficient radiant energy to generate an acid without de-blocking said polymer; and
   c. in the absence of a post-exposure baking step, treating the exposed layer with a gaseous base to neutralize the acid generated in step (b) to a salt via an acid-base reaction; and
   d. removing excess base; and
   e. overall flood exposing the layer to generate an acid in areas not exposed in step (b); and
   f. baking the exposed layer of step (e) at a sufficient temperature and for a sufficient time to deblock said polymer in the area not exposed in step (b); and
   g. developing the layer with an aqueous alkaline developer to remove the layer except for the portion exposed in step (b).

2. The method of claim 1 wherein the polymer is an imide-containing polymer where the imide functionalities have been blocked with an acid-labile group.

3. The method of claim 2 wherein the polymer is poly(N-tert-butyloxycarbonyl maleimide-co-styrene).

4. The method of claim 2 wherein the polymer is poly(N-tert-butyloxycarbonyl maleimide-co-4-tert-butyl styrene).

5. The method of claim 2 wherein the polymer is poly(N-tert-butyloxycarbonyl maleimide-co-decyl vinyl ether).

6. The method of claim 2 wherein the polymer is poly(dimethyl-N-tert-butyloxycarbonyl glutarimide).

7. The method of claim 2 wherein the polymer is poly(N-tert-butyloxycarbonyl maleimide).

8. The method of claim 2 wherein the blocking group is tert-butyloxycarbonyl.

9. The method of claim 2 wherein the blocking group is benzyloxycarbonyl.

10. The method of claim 1 wherein the polymer is a phenol containing polymer where the hydroxy functionalities have been blocked with an acid-labile group.

11. The method of claim 10 wherein the polymer is poly(tert-butyloxycarbonyloxy-alpha-alkyl styrene).

12. The method of claim 10 wherein the polymer is poly(tert-butyloxycarbonyloxy styrene).

13. The method of claim 10 wherein the blocking group is tert-butyloxycarbonyl.

14. The method of claim 10 wherein the blocking group is benzyloxycarbonyl.

15. The method of claim 1 wherein the polymer is a carboxylic acid containing polymer where the acid functionalities have been blocked with an acid-labile group.

16. The method of claim 15 wherein the polymer is poly(tert-butyl methacrylate).

17. The method of claim 15 wherein the polymer is poly(tert-butyl p-vinylbenzoate).

18. The method of claim 2 wherein the acid labile group is an oxycarbonyl group.

19. The method of claim 1 wherein said polymer contains imide groups blocked by a methylol group or substituted methylol group and further blocked to form an acetal or ketal moiety.

20. The method of claim 19 wherein said polymer is a homopolymer of blocked maleimide.

21. The method of claim 19 wherein said polymer of (a) is a copolymer containing no more than 5 units of the comonomer for each blocked imide group.

22. The method of claim 19 wherein said copolymer contains up to about one unit of comonomer for each blocked imide group.

23. The method of claim 19 wherein the polymer has the structure

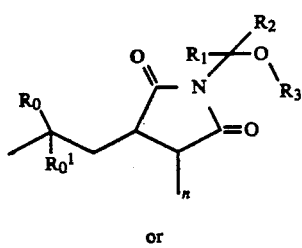

or

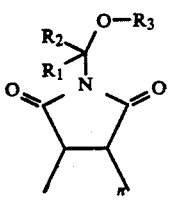

where:
R₀ is H or methyl
R₀¹ is aryl, O-alkyl, or O-aryl
R₁ and R₂ are H or C₁ to C₄ alkyl
R₃ is

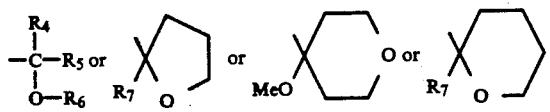

where:
R₄, R₅ are H or C₁ to C₄ alkyl
R₆ is C₁ to C₁₀ alkyl
R₇ is C₁ to C₄ alkyl or H 24. The method of claim 23 wherein R₀1 is aryl or substituted aryl.

25. The method of claim 24 wherein R₀1 is phenyl.

26. The method of claim 23 wherein R₀1 is —O—(C₁ to C₁₀ alkyl) or —O—aryl.

27. The method of claim 26 wherein R₀1 is —O—(n-decyl).

28. The method of claim 23 wherein R₀1 is phenyl and R₃ is —C(CH₃)₂OCH₃.

29. The method of claim 23 wherein R₀1 is phenyl and R₃ is —C(CH₃)(H)OCH₃.

30. The method of claim 23 wherein R₀1 is phenyl and R₃ is

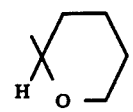

31. The method of claim 23 wherein R₀1 is phenyl and R₃ is

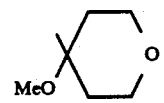

32. The method of claim 1 wherein the oxime sulfonate ester component comprises one or more compounds selected from the group consisting of

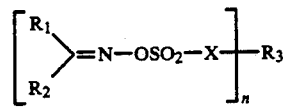

and

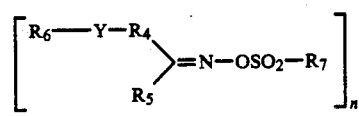

where
n is 1 or 2,
R₁ is —COO alkyl or —COO aryl or —CN, and
R₂ is alkyll or aryl, or phenyl unsubstituted or substituted by C₁-C₆ alkyl, —OH, —CN, C₁-C₄-alkoxy, aryloxy, —COO aryl, —COO alkyl, or NO₂ or
R₂ and R₁ together with the atom to which they are bound form a C₅-C₁₀ carbocyclic or heterocyclic ring; and
X and Y are independently selected from the group consisting of a direct bond, —CH₂—, or unsubstituted or substituted C₂-C₅ alkylene, and
R₃ is, when n=1, C₁-C₁₈-alkyl or phenyl which may be unsubstituted or substituted by —OH, —CN, halogen, C₁-C₁₂-alkyl, C₁-C₄-alkoxy, or NO₂; or naphthyl which is unsubstituted or substituted, or R₃ and R₂, or R₃ and R₁ together with the atoms to which they are bonded form a C₅-C₁₂ heterocyclic ring, and R₃ is, when n=2, a (CH₂)ₘ group, wherein m is 2 to 8, or phenylene or naphthylene which are unsubstituted or substituted; and
R₄ is arylene, substituted arylene, methylene, C₂-C₆ straight, branched, or cyclic alkylene; and
R₅ is cyano, or a —COO alkyl or —COO aryl group; and
R₆ is, when n=1, a hydrogen atom, or C₁-C₈ alkyl, or phenyl, phenyl substituted with —OH, CN, C₁-C₄ alkoxy, aryloxy, —COO alkyl, —COO aryl, NO₂, or, or halogen; or R₅ and R₆ together with the atoms to which they are bound form a C₆-C₁₂ carbocyclic or heterocyclic ring; and $R_7$ is phenyl, unsubstituted or substituted by —OH, —CN, alkoxy, halogen, or $C_1$-$C_5$ alkyl, $C_1$-$C_{18}$ straight or branched alkyl which may be substituted or unsubstituted; or $C_6$-$C_{12}$ aryl, substituted or unsubstituted, or $R_7$ and $R_6$ or $R_5$ and $R_7$, together with the atoms to which they are bound, form a $C_6$-$C_{12}$ heterocyclic ring.

33. The method of claim 1 wherein said composition comprises a residual solvent component comprising of one or more components selected from the group consisting of propylene glycol monoalkyl ether and propylene glycol monoalkyl ether acetate.

34. The method of claim 1 wherein said composition further comprises one or more components selected from the group consisting of colorants, dyes, anti-striation agents, leveling agents, plasticizers, adhesion promoters, speed enhancers, solvents and surfactants.

35. The method of claim 1 wherein said substrate is selected from the group consisting of silicon, aluminum, polymeric resins, silicon dioxide, doped silicon dioxide, silicon nitride, tantalum, copper, polysilicon, ceramics and aluminum/copper mixtures.

* * * * *